United States Patent
Hellmark et al.

[11] Patent Number: 5,982,233
[45] Date of Patent: Nov. 9, 1999

[54] DEVICE AND METHOD FOR COMPENSATING PHASE DISTORTION

[75] Inventors: Leif Martin Hellmark; Torsten John Carlsson, both of Lund, Sweden

[73] Assignee: Telefonaktiebolaget LM Ericsson, Stockholm, Sweden

[21] Appl. No.: 08/880,863

[22] Filed: Jun. 23, 1997

[30] Foreign Application Priority Data

Jun. 28, 1996 [SE] Sweden .................................. 9602585

[51] Int. Cl.⁶ ............................................ H03F 1/26
[52] U.S. Cl. ......................... 330/149; 330/107; 330/136
[58] Field of Search .................... 330/107, 129, 330/136, 137, 149; 332/109, 159, 162; 331/DIG. 2

[56] References Cited

U.S. PATENT DOCUMENTS

| | | | |
|---|---|---|---|
| 4,412,337 | 10/1983 | Bickley et al. | 375/60 |
| 4,700,151 | 10/1987 | Nagata | 332/18 |
| 5,101,211 | 3/1992 | DuFort | 342/174 |
| 5,247,542 | 9/1993 | Onodera et al. | 375/60 |
| 5,420,536 | 5/1995 | Faulkner et al. | 330/149 |
| 5,675,288 | 10/1997 | Peyrotte et al. | 330/149 |
| 5,710,525 | 1/1998 | Tanaka et al. | 331/DIG. 2 |

FOREIGN PATENT DOCUMENTS

| | | |
|---|---|---|
| 0 441 579 A1 | 2/1990 | European Pat. Off. |
| 0 367 458 A2 | 5/1990 | European Pat. Off. |
| 0 632 575 A1 | 1/1995 | European Pat. Off. |
| 2 135 546 | 8/1984 | United Kingdom . |
| 2 265 270 | 9/1993 | United Kingdom . |
| WO 95/23453 A1 | 8/1995 | WIPO . |

*Primary Examiner*—Steven J. Mottola
*Attorney, Agent, or Firm*—Burns, Doane, Swecker & Mathis, L.L.P.

[57] ABSTRACT

The present invention relates to a method of compensating for the phase distortion that occurs in a power amplified output signal in response to the output power of a power amplifier. The invention also relates to a phase distortion compensating device. The device includes a phase-locking and upconversion loop (30–39) which is connected to the input of a power amplifier (40). Briefly, the solution involves feeding a part of the signal ($e_{pha}$) to be amplified back to a circuit (35) which combines this first-mentioned signal with a part of the amplified signal ($e_{out}$) fed back from the output of the power amplifier (40), so as to achieve a smooth transition in the dominance of one signal over the other signal when the two signals are combined to obtain a new feedback signal ($e_{fdb}$) from the combining circuit (35).

14 Claims, 5 Drawing Sheets

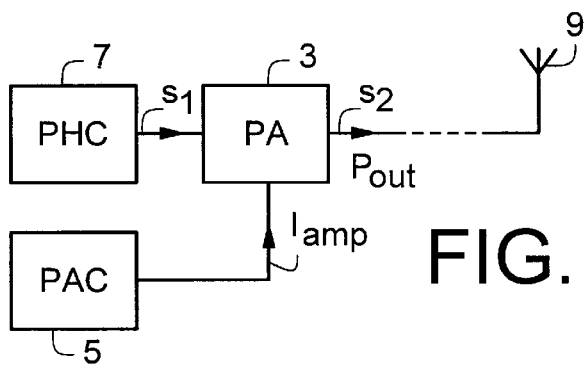
FIG. 1A
FIG. 1B
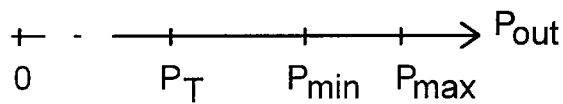
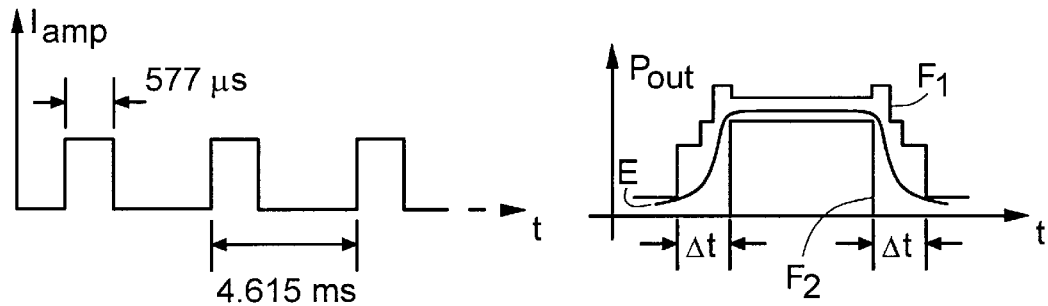
FIG. 2A
FIG. 2B
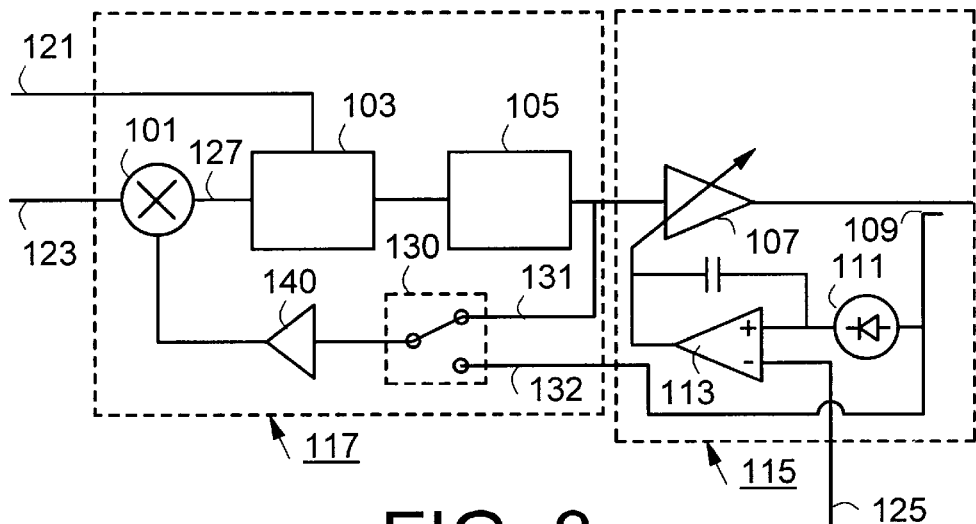
FIG. 3
PRIOR ART

DEVICE AND METHOD FOR COMPENSATING PHASE DISTORTION

FIELD OF INVENTION

The present invention relates to a method of compensating for the phase distortion that occurs in a power amplified output signal due to the output power of a power amplifier. The invention also relates to a phase distortion compensating device.

BACKGROUND OF THE INVENTION

The digital GSM system (Global System for Mobile Communication) utilizes TDMA (Time Division Multiple Access). In this technique, each carrier frequency is divided into eight time slots, therewith enabling eight calls to be served simultaneously on one and the same carrier frequency. Each terminal includes a power amplifier in the terminal transmitter part that feeds radio frequency modulated information to an antenna. The function of the power amplifier is to amplify the signals sufficiently for their reception in the nearest base station to be acceptable. This function shall be carried out with the smallest possible power addition from the terminal batteries, because of their limited capacity.

Power amplifiers tend to cause phase distortion in a delivered output signal. This distortion is dependent on output power and will increase with increased output power. This distortion can be expressed in a mathematical vector model: $y(t)=re^{j\omega t+f(r)}$. The amplification r, which in this case is the same as the amplitude, is included as a variable in the phase function f(r). The amplification/amplitude can thus be said to have a phase modulating effect on the output signal.

Some non-linear amplifiers exhibit pronounced phase distortion at high powers, although these amplifiers can nevertheless be used in some applications, since they have a greater efficiency than linear amplifiers.

Pulsed amplifiers are used in TDMA applications. The power is thus ramped up to an output power suitable for transmission, in accordance with a ramp function. When transmission is terminated, the power is ramped down in a corresponding manner, in accordance with a ramp function. Upramping and downramping of the output power takes place during very short time intervals. The phase modulation dependent on this upramping and downramping of the output power results in broadening of the frequency spectrum of the output signal, Phase modulation compensation enhances the possibilities of fulfilling given standard requirements (e.g. GSM).

It is known from published PCT Application WO-A1-95/23453 (Motorola) to counteract phase distortion with a feedback that is connected to the power amplifier output and encloses the power amplifier in a phase-locking loop. The power amplifier is fed with a phase modulated signal from a phase modulation control loop that includes a phase-locking loop with a feedback loop connected to the input of the power amplifier. The inclusion of a switching circuit in the phase modulation control loop enables a switch to be made between the two feedbacks. However, it is impossible in practice to achieve fast phase-locking to the correct phase by switching between the feedback loops in the known manner. Because respective upramping and downramping takes place very quickly, problems occur, particularly in the case of TDMA radio applications that use pulsed amplifiers. The overshoots that are generated in the envelope of the output signal are fed back and added to the transients caused by switching between the two feedbacks. Phase-locking therewith takes an unacceptably long time to achieve. Phase-locking may even fail to take place. These drawbacks and problems may result in the total or partial loss of important information stored in a signal. It can therefore be considered desirable to find a novel solution to these drawbacks and problems with which earlier known techniques are encumbered.

SUMMARY OF THE INVENTION

The present invention addresses the problem of as to how the phase modulating effect of the amplitude can be compensated in respect of pulsed power amplifiers.

Another problem addressed by the invention is concerned with the manner in which a phase detector can be locked to the correct phase quickly, positively and in good time prior to upramping or downramping of the power amplifier.

As established in the aforegoing, earlier known phase-locking techniques are encumbered with certain drawbacks and problems. These drawbacks and problems are addressed by the present invention.

One object of the present invention is to provide a method and a device that compensates for the phase modulating effect of the amplitude.

Another object of the present invention is to provide a method and a device that eliminates transients and noisy feedback signals.

Yet another object of the present invention is to provide a method and a device that enables a phase detector to lock to the correct phase quickly, positively and in good time before upramping or downramping the power of the power amplifier.

Yet another object of the present invention is to provide a method and a device that counteract the drawbacks and problems associated with prior art phase-locking techniques.

In brief, the solution involves feeding the signal to the amplified back to a circuit that combines a part of this first-mentioned signal with a part of the amplified signal fed back from the output of the power amplifier so as to effect a smooth transition in the dominance of one signal over the other signal when the two signals are combined to form an output signal from the combining circuit.

A phase-locking and frequency upconversion loop includes a phase detector, an integrating filter circuit connected to said detector, a voltage controlled oscillator connected to the output of said filter circuit, and a feedback loop connected to an input of a mixer that includes a further input for a signal arriving from a local oscillator source and an output that is connected to one of the two inputs of the phase detector. A power amplifier is connected to the output of the voltage controlled oscillator, although the amplifier is not included in the loop. The concept involves utilising the existing phase-locking and upconversion loop by supplementing said loop with a signal combining device, a so-called combination circuit, and also with a second feedback loop from the output of the power amplifier. The power amplifier can therewith be included in the phase-locking and upconversion loop. The phase-locking and up-conversion loop may also be referred to as a phase modulation control loop that has phase-locking and frequency upconverting functions. Before starting upramping of the power amplifier, the loop is locked on the output signal from the voltage controlled oscillator with the aid of the first feedback loop. As the output power increases, the signal fed back from the output of the power amplifier via the second feedback loop will gradually obtain dominance over the oscillator signal fed back via the first feedback loop. This gradual (or successive) change in the ratio between the signals from the two feedback loops in a new feedback signal can be described as a smooth transition. When the loop has a sufficiently high bandwidth, the phase shift of the power amplifier during the upramping period will be eliminated.

One advantage of the present invention is that the transition is smooth, there being generated no transients that would extend the time taken for a phase-locking function in a phase modulation control loop to lock onto the correct phase.

Another advantage afforded by the present invention is that broadband noise from sources upstream of the phase detector in the phase modulation control loop are effectively filtered out. One such source may be the noise generated by an IQ modulator.

Another advantage is that a designer has a greater freedom of choice in choosing between different existing power amplifiers that can be given desired properties by application of the inventive concept.

Another advantage afforded by the invention is that it can be used in mobile telephony applications, irrespective of whether the information signal is phased modulated or amplitude modulated.

The invention will now be described in more detail with reference to preferred embodiments thereof and also with reference to the accompanying drawings.

BRIEF DESCRIPTION OF THE DRAWINGS

FIG. 1A is a block schematic illustrating a transmitter provided with an antenna.

FIG. 1B is a power axis that illustrates the relative state between different transmitter output powers.

FIG. 2A is a time-amplitude diagram showing how the control signal $I_{amp}$ varies with time in accordance with the established GSM standard.

FIG. 2B is a diagram that shows the variation of the output power $P_{out}$ with time, where the power amplifier is controlled in accordance with the GSM standard.

FIG. 3 is a block schematic illustrating a prior art transmitter.

DETAILED DESCRIPTION OF PREFERRED EMBODIMENTS

Figure 4:
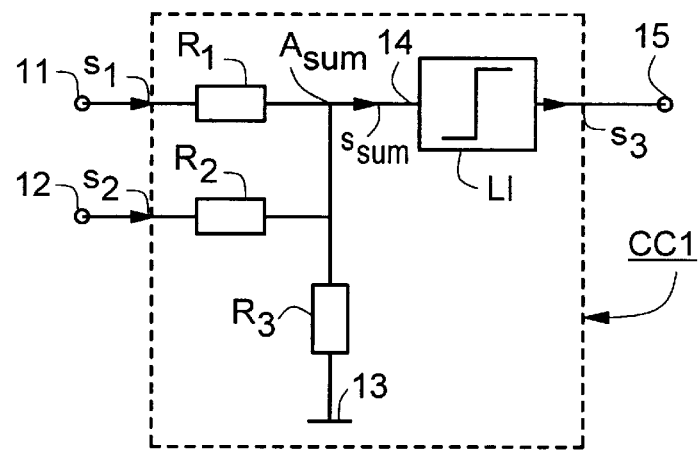
FIG. 4 is a circuit diagram of one embodiment of a combination circuit.

The embodiments of the invention described hereinafter are related to applications in radio communication transmitters.

It will be understood, however, that phase distortion compensation in accordance with the inventive concept can be applied in other applications.

FIG. 1A is a block schematic illustrating a power amplifier 3 (PA) included in a transmitter and having a signal input for an input signal $S_1$, a control input for a control signal $I_{amp}$ and a signal output for a signal $s_2$ having an output power $P_{out}$. The input signal $I_{amp}$ is generated in an amplifier control device 5 (PAC) that functions to control the output power $P_{out}$. A phase modulation control loop 7 generates the signal $s_1$. The amplifier control device is not described in detail in this document.

In the duration of the time slot used, the power amplifier 3 delivers the output power $P_{out}$ at two values which lie between $P_{max}$ and $P_{min}$. The signal $s_1$ delivered to the power amplifier has a constant input power. The two feedback signals $s_1$ and $s_2$ are weighted equally at a given output power $P_{out}=P_T$, $P_T<P_{min}$. FIG. 1B illustrates the relative state of the output powers in relation to the power $P_T$.

The power amplifier 3 is controlled with the aid of the control signal $I_{amp}$ such as to pulse the output power in accordance with what is specified for a relevant mobile telephony system, for instance. FIG. 2A shows how the control signal $I_{amp}$ varies with time in accordance with the established GSM standard. Control of the power amplifier 3 results in control of the output power. FIG. 2B shows the envelope E of the output signal $P_{out}$ with upramping and downramping of the output of the power amplifier 3. Time is referenced t in this Figure. A smooth output power envelope is strived for, in order to counteract broadening of the spectrum of transmitted signals. The time templates, $F_1$ and $F_2$, to which the output power must be adapted and which are specified in the GSM standard are also included schematically in FIG. 2B. The duration of an upramping or downramping occasion must not exceed $\Delta T=28$ μs.

FIG. 3 is a block schematic illustrating the aforesaid prior transmitter from PCT Application WO-A1-95/23453. The known transmitter is, in principle, divided into a phase modulation control loop 117 and an amplitude modulation control loop 115. The amplitude modulation control loop includes a power amplifier 107, a directional coupler 109, and an envelope detector 111 that is connected to one of the signal inputs on the difference amplifier 113. An amplitude reference signal 125 is applied to the other signal input. The difference amplifier 113 generates a voltage difference signal as a result of the difference between the two signal inputs. The difference amplifier is connected to an input for amplification control of the power amplifier 107. Amplitude modulation of the output signal from the power amplifier is achieved, by varying the voltage of an amplitude reference signal.

The frequency translation of a phase reference signal 121 to a correct channel frequency has been solved in this known device with the phase modulation control loop 117. The loop includes a mixer 101, a phase detector 103 and a voltage controlled oscillator, VCO, 105 and a feedback coupling 131 from the oscillator output to a switch circuit 130. As before mentioned, non-linear amplifiers exhibit pronounced phase distortion at high powers. This distortion can be counteracted with a feedback 132 which is connected to the output 109 of the power amplifier and which therewith encloses the power amplifier in the phase modulation loop. The inclusion of a switching circuit 130 in the phase modulation control loop enables a switch to be made between the two feedbacks 131 and 132. One of the feedback signals is fed back to the mixer 101. The mixer generates an intermediate frequency signal 127 whose frequency is equal to the difference between a frequency reference signal 123 and the signal that is fed back from the switching circuit 130. The phase detector 103 generates an error signal that is dependent on the phase difference of the intermediate frequency signal 127 and the phase reference signal 121. The error signal is applied to the frequency control input of the oscillator. The oscillator output signal obtains in this way a phase that is approximately equal to the phase of the phase reference signal 121, meaning that the output signal has been phase modulated with the phase reference signal 121. The frequency of the output signal is dependent on the sum of the alternative difference between the frequency of the frequency reference signal and the frequencies of the phase reference signal.

However, it is practically impossible to achieve fast locking to the correct phase by switching between the two feedbacks in accordance with the known method. The problem is that upramping and downramping take place very quickly. Switching between the two feedbacks results in a phase disturbance that is unable to decay quickly enough. The loop loses its locking in the worst of cases.

It has been found more convenient to replace the switching circuit 130 with a combining device, a combination circuit that results in smooth transition between the two feedback signal loops, in accordance with the present invention. When the power amplifier is linear, the output signal from the combination circuit to the phase detector is dominated by the feedback signal from the output of the voltage controlled oscillator at low power outputs. In the event of rapid upramping of the output power with an increasing phase distortion as a result, the signal contribution from the feedback that includes the power amplifier will also increase. This is dealt with by the combination circuit in pace with the increase in the amplitude of the output signal. The phase detector then has time to eliminate the phase error. At full amplifier output power, the feedback output signal fully dominates the combination circuit output signal. The combination circuit may either be circuitry that includes solely passive components, or circuitry that includes active components (transistors).

An embodiment of a combination circuit that includes passive components and a combination circuit that includes active components will be described hereinafter. Both embodiments include a limiting circuit. Limiting is necessary in order to guarantee that the downstream mixer will operate correctly, meaning that the mixer output amplitude will be constant. A combination circuit constitutes an addition of the two feedback signals $s_1$ and $s_2$ in FIG. 1A.

FIG. 4 illustrates an embodiment of a combination circuit CC1 that is implemented with passive components—in the illustrated case resistances $R_1$ and $R_2$—and a limiter LI.

The feedback signals from $s_1$ and $s_2$ in FIG. 1A are each applied to a respective signal input 11 and 12. Each signal input includes one of the respective resistances $R_1$ and $R_2$. The signal inputs are connected to a common summation point $A_{sum}$ for the signals $s_1$ and $s_2$. A voltage source 13 is also connected to the summation point $A_{sum}$, via a resistance $R_3$. The point $A_{sum}$ is connected to an input 14 on the limiter LI. Since the signal $s_1$ is constant and also relatively weak in comparison with the signal $s_2$ that is fed back from the output of the power amplifier, the signals will preferably be weighted. Suitable choice of values of respective resistances enables the two signals to be summated to a new signal $s_{sum}$ which is limited in the limiter LI to a new feedback signal $s_3$ on the common output 15 of the limiter and the combination circuit CC1. Weighting is effected so that the transition from the state in which $s_1$ dominates in the feedback signal $s_3$ to the state in which $S_2$ is dominant, and vice versa, takes place at a suitable output power. It is determined that the transition shall take place when the output power from $s_2$ has become greater than $P_T$ (see FIG. 1B), where $P_T<P_{min}$. By dominance is meant that one of the signals constitutes a greater part of the feedback signal. As before mentioned, limiting is necessary in order to guarantee that following circuits will operate correctly.

The described feedback of a signal $s_3$ from the combination circuit CC1 means that the power amplifier 3 (PA) in FIG. 1A will be enclosed in a phase-locking loop to the phase modulation control loop 7 (PHC), which therewith phase-locks the output signal $s_2$ from the power amplifier 3.

Figure 5:
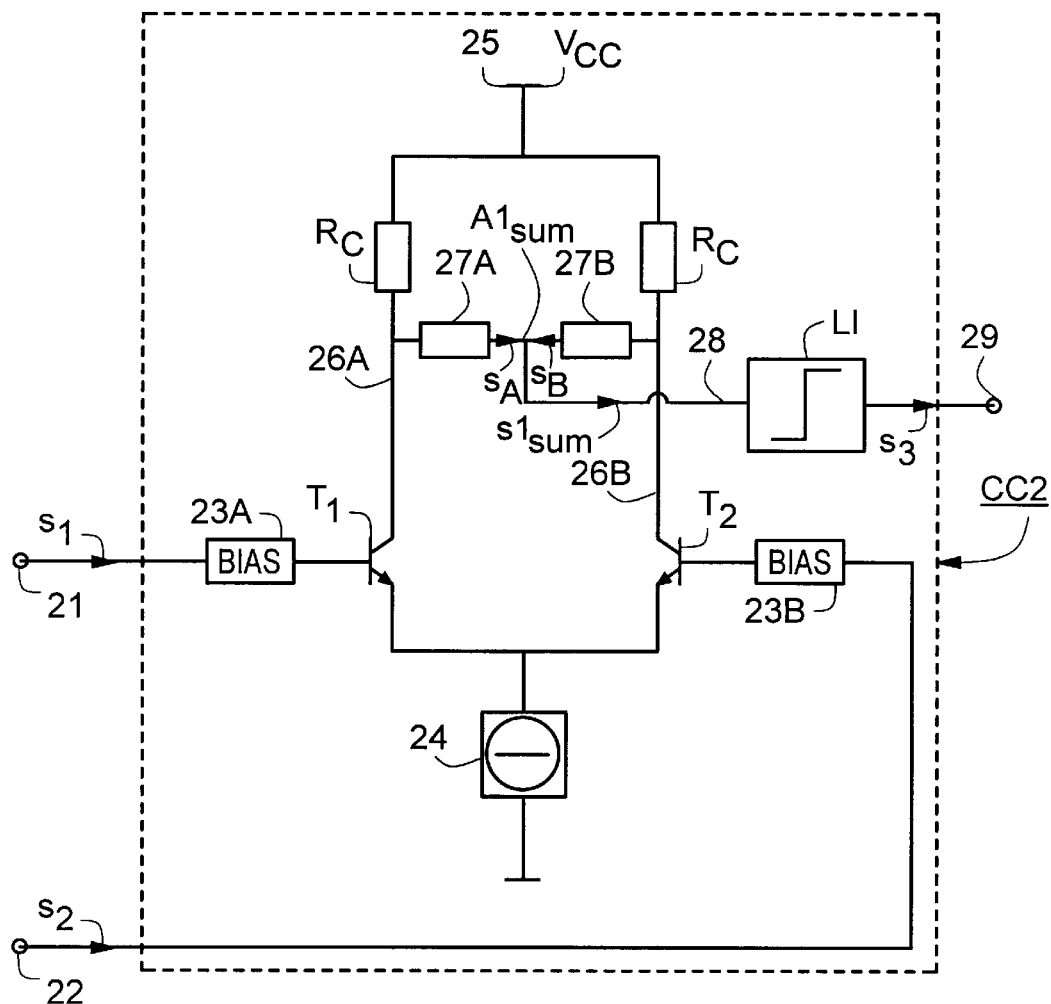
FIG. 5 is a circuit diagram of another embodiment of a combination circuit.

FIG. 5 illustrates another advantageous embodiment of a combination circuit CC2. This circuit CC2 is implemented with active components. The circuit is an amplifier that has two inputs 21 and 22. The signals that are fed back from $s_1$ and $s_2$ in FIG. 1A are each applied to a respective one of the signal inputs 21 and 22. The amplifier includes two transistors T1 and T2. The signal $s_1$ on the input 21 is applied to the base of the transistor T1 via a biasing circuit 23A. The signal $s_2$ on the input 22 is applied to the base of the transistor T2 via a biasing circuit 23B. Both transistors are bipolar NPN transistors in the illustrated case, although other types of transistors may be used. The emitters of the transistors are connected to a common constant current generator 24. The transistors are powered by a drive voltage $V_{CC}$ from a voltage source 25. The amplifier has two arms. The collector of the transistor T1 is connected to the voltage source 25 via the arm 26, and the collector of the transistor T2 is connected to the voltage source 25 via the other arm 27. As illustrated in FIG. 5, each arm may include a collector resistor $R_C$. A signal $s_A$ flows from the arm 26A, via a component 27A. A signal $s_B$ flows from the arm 26B, via a component 27B. The outputs of the resistances 27A and 27B are connected to a common summation point $A1_{sum}$. This point is connected to an input 28 on the limiter LI. The arms 26A and 26B are thus combined with the components 27A and 27B in a manner to obtain a weighted sum $s1_{sum}$ of the feedback signals $s_1$ and $s_2$ at the point $A1_{sum}$. The new signal $s1_{sum}$ is limited in the limiter LI to a new feedback signal $s_3$ on the limiter output 29, which is also a signal output for the combination circuit CC2.

Feedback of the signal $s_3$ from the combination circuit CC2 means that the power amplifier 3 in FIG. 1A will be enclosed in a phase-locked loop to the phase modulation control loop 7, which therewith phase-locks the output signal $s_2$ from the power amplifier 3.

Figure 6:
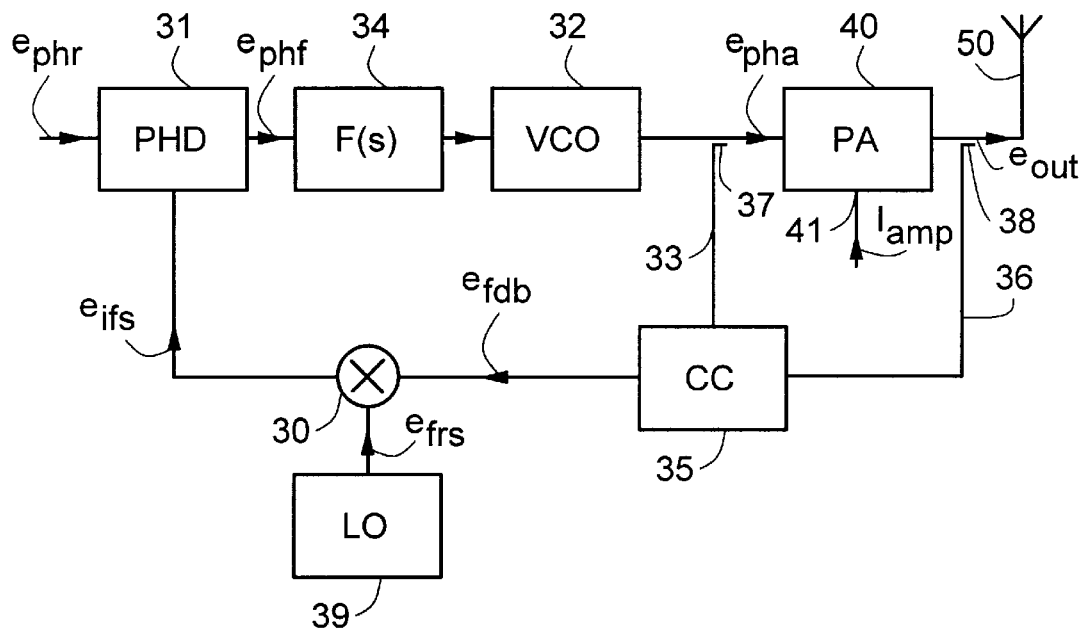
FIG. 6 is a block schematic illustrating one embodiment of an inventive phase distortion compensating device.

FIG. 6 illustrates a preferred embodiment of the inventive phase distortion compensating device. The signal incoming to the device is a phase signal $e_{phr}$, i.e. a signal in which the information is found in the phase. The phase signal $e_{phr}$ contains the phase information to be modulated and transmitted on an appropriate carrier frequency.

Frequency upconversion of the phase signal $e_{phr}$ to the correct channel frequency is effected in a phase modulation control loop for phase-locked and frequency upconversion. The loop includes a mixer 30, a phase detector 31, a voltage controlled oscillator, VCO, 32, an integrating filter circuit 34, a combination circuit 35 and a feedback 33 from the output of the oscillator 32 to a first input of the combination circuit 35 through the medium of a first tap means 37. The oscillator 32 is connected to an input of a power amplifier 40, the output of which is connected to an antenna 50. The phase modulation control loop also includes a second feedback 36 from the output of the power amplifier 40, to a second input of the combination circuit 35 through the medium of a second conductor means 38. This circuit may be constructed in the manner described with reference to FIG. 4 or to FIG. 5.

The mixer 30 generates an intermediate frequency signal $e_{ifs}$ whose frequency is equal to the difference between a frequency reference signal $e_{frs}$ from a frequency synthesiser 39 and a feedback signal $e_{fdb}$ from the combination circuit 35. The feedback signal $e_{fdb}$ corresponds to $s_3$ in FIGS. 4 and 5.

The phase detector 31 generates an error signal $e_{phf}$ which is dependent on the phase difference of the intermediate frequency signal $e_{ifs}$ and the phase signal $e_{phr}$. The integrating filter circuit 34 is connected between the phase detector and the voltage controlled oscillator so as to reduce the risk of phase distortion, noise transmission and band broadening as a result of broadband noise. The filter circuit effectively eliminates broadband noise. The noise derives from sources within the phase detector. One such source may be an IQ modulator used in certain types of radio transmitter.

The error signal $e_{phf}$ is applied to the input of the filter circuit 34 and from there to the frequency control input of the oscillator 32. The output signal $e_{pha}$ from the oscillator 32 thus obtains a phase that is approximately equal to the phase of the phase signal $e_{phr}$, meaning that the output signal $e_{pha}$ has been phase modulated with the phase signal $e_{phr}$. The frequency of the output signal $e_{pha}$ is equal to the sum of or the difference between the frequency of the frequency reference signal $e_{frs}$ and the frequency of the phase signal $e_{phr}$.

The signal $e_{pha}$ is coupled to the power amplifier 40 which amplifies the signal $e_{pha}$ in response to the control signal $I_{amp}$. An antenna signal $e_{out}$ on the output of the amplifier 40 to the antenna 50 will then have the form determined by the control signal $I_{amp}$.

If this embodiment is included in a transmitter that operates in accordance with GSM standards, the output signal will obtain the envelop presented in FIG. 2B. The output signal $e_{out}$ corresponds to the signal $s_2$ in FIG. 1A, and the signal $e_{pha}$ corresponds to the signal $s_1$.

Figure 10:
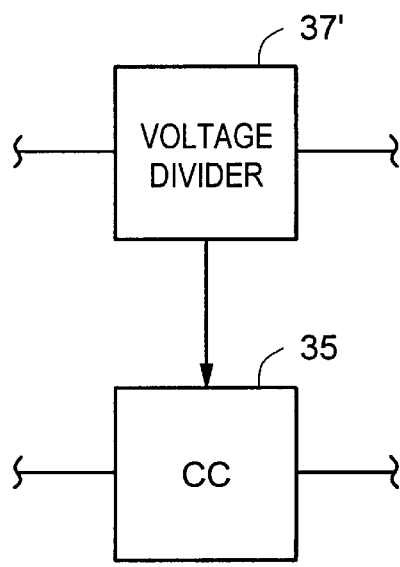
FIG. 10 is a partial block diagram depicting the signal taps as a voltage divider.

The combining means, the combination circuit 35, receives a part of the signal $e_{pha}$ and a part of the signal $e_{out}$ each through the medium a respective signal tap 37 and 38. These signal taps may have the form of directional couplers or some form of voltage divider 37' (capacitive or resistive taps) illustrated in FIG. 10. The two loops 33 and 36 connect a respective tap 37 and 38 to its particular input on the combination circuit 35. This combines the two signals $e_{pha}$ and $e_{out}$ from respective loops in accordance with the amplification of the amplifier 40, to provide a new feedback signal $e_{fdb}$ in the loop. The taps 37 and 38 each take out a specific part of respective signals $e_{pha}$ and $e_{out}$. These taps may also be controllable. The magnitude of respective signal parts that are taken out in this way can therewith be controlled individually, which may be to advantage. A controllable directional coupler is an example of one such tap.

Before starting upramping of the power amplifier PA 40, the loop is locked on the output signal from the voltage controlled oscillator 32 with the aid of the first feedback loop 33. As the output power increases in response to the control signal $I_{amp}$, the signal $e_{out}$ that is fed back from the power amplifier output through the medium of the second feedback loop 36 will gradually obtain domination over the oscillator signal $e_{pha}$ fed back through the medium of the first feedback loop 33 as feedback signal $e_{fdb}$.

Without the loop 33, phase-locking would not be achieved in good time prior to activating the power amplifier, when starting up the transmitter. When the loop has a sufficiently broad bandwidth, the loop will have time to compensate for the phase shift in the power amplifier 40 during upramping of the output power. A feedback shall be established via the loop 36 and said locking achieved in order to achieve the intended phase distortion compensation at roughly 10 dB with full output power.

The phase distortion compensating device of this embodiment includes an amplifier 40 that has an input connected to an output of a phase-locking and upconversion loop. This loop includes a first and a second feedback loop, 33 and 36 respectively, wherein the first feedback-loop 33 is connected to tap means 37 for tapping off a part of a modulated signal on the power amplifier input, and the second feedback loop 36 is connected to a tap means 38 for tapping off a part of the amplified modulated signal on the output of the power amplifier 40.

Each of the loops 33 and 36 is connected to a respective input of the combining means 35, which combines the two input signals from respective loops so as to generate a new feedback signal in the loop.

The phase distortion compensating method according to this embodiment involves combining the two signals $e_{pha}$ and $e_{out}$ from respective loops 33 and 36 to generate the new feedback signal $e_{fdb}$ in the loop. If amplification in the amplifier 40 changes, the proportionality in which the feedback signals are fed back and their dominance in the feedback signal to the phase-locking and upconversion loop will also change. The inventive method provides a smooth and continuous transition between the parts of the signals that are fed back and therewith the dominance in the feedback signal, so as to enable the phase-locking and upconversion loop to be phase-locked in time before a rapid change in the output power of the power amplifier begins to take place, while maintaining phase-locking during upramping and downramping. In accordance with the inventive method, the dominance in the new feedback signal of the feedback signal that is taken out from the output of the power amplifier 40 increases with increasing amplifier output powers. The signal fed back from the power amplifier output is dominating in the new feedback signal when the power amplifier amplifies with full output power, whereas the signal fed back from the power amplifier input is dominating in the new feedback signal when the amplifier output power is low.

As a result of the inventive method, the phase-locking and upconversion loop is locked onto the modulated signal $e_{pha}$ on the input of the power amplifier 40 before the output power of the power amplifier increases. When upramping of the amplifier has begun, the phase-locking and upconversion loop is locked onto the amplified modulated signal on the power amplifier input before the output power of the power amplifier has reached its full strength.

Figure 7:
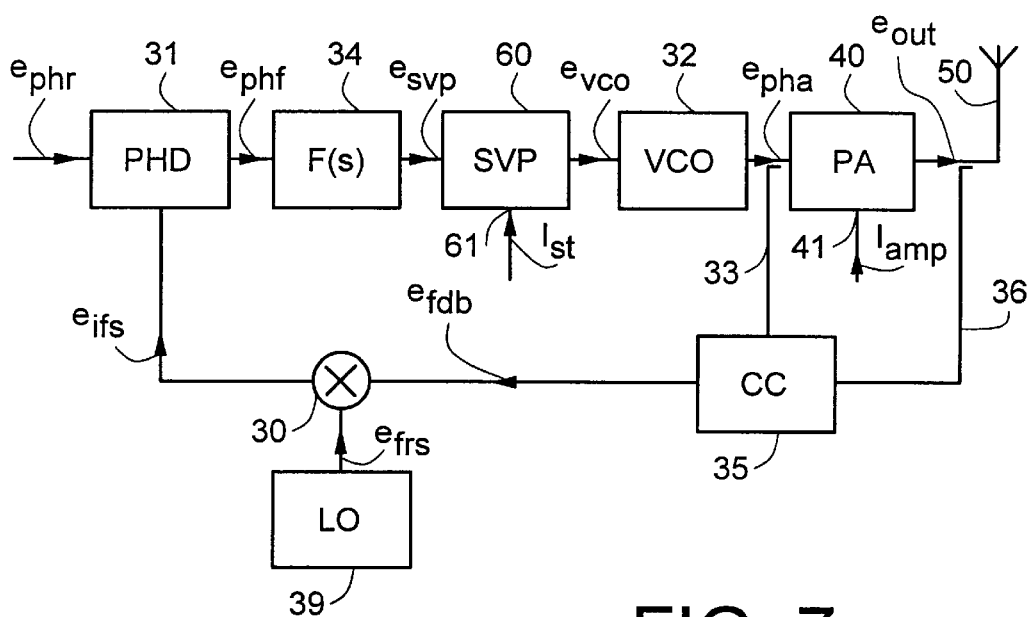
FIG. 7 is a block schematic illustrating another embodiment of the inventive phase distortion compensating device.

FIG. 7 illustrates an embodiment which differs slightly from the inventive device illustrated in FIG. 6. According to the block schematic shown in FIG. 6, the phase modulation control loop includes the phase detector 31, the filter circuit 34, the oscillator 32, the combination circuit 35, the mixer 30 and the local oscillator 39. The phase modulation control loop in FIG. 7 also includes a sweep circuit 60 (SVP) connected between the voltage controlled oscillator 32 (VCO) and the filter circuit 34. In order to ensure fast phase-locking of the loop, the control voltage of the oscillator VCO is swept over the voltage interval in which the oscillator is expected to lock. The sweep can be initiated and stopped with a control signal $I_{st}$ on a control input 61 of the sweep circuit 60. The frequency of the oscillator output signal is varied, by varying the control voltage to the oscillator.

Figure 8A:
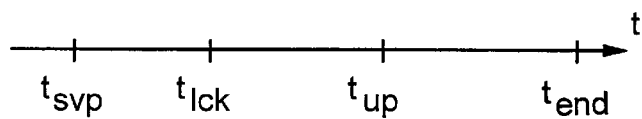
FIG. 8A illustrates the principle of the phase-locking time control of the device shown in FIG. 7, with the aid of a time axis and marked time points.

FIG. 8A illustrates the principle of time-controlling the phase-locking of the device shown in FIG. 7 with the aid of a time axis and marked time points. A start pulse $I_{st}$ starts the sweep circuit at time point $t_{svp}$, and the output voltage of the circuit to the voltage controlled oscillator 32 is changed with time in accordance with a predetermined function over a suitable voltage interval in which the loop is expected to lock. Sweeping of the voltage interval is commenced in good time before the time point $t_{up}$ at which upramping of the output power from the power amplifier 40 (PA) commences. It is necessary that the sweep circuit 60 has time enough to sweep once over the voltage interval. The loop locks at an arbitrary time point $t_{lck}$ and remains locked during upramping and downramping, which occur at respective time points $t_{up}$ and $t_{down}$. The loop can be kept locked because the combination circuit 35 produces a "smooth" successive transition from one feedback loop 33 to the other feedback loop 36. On the other hand, phase-locking is lost when a fast switch is made, therewith resulting in a loss of information in the output signal from the power amplifier.

Figure 8B:
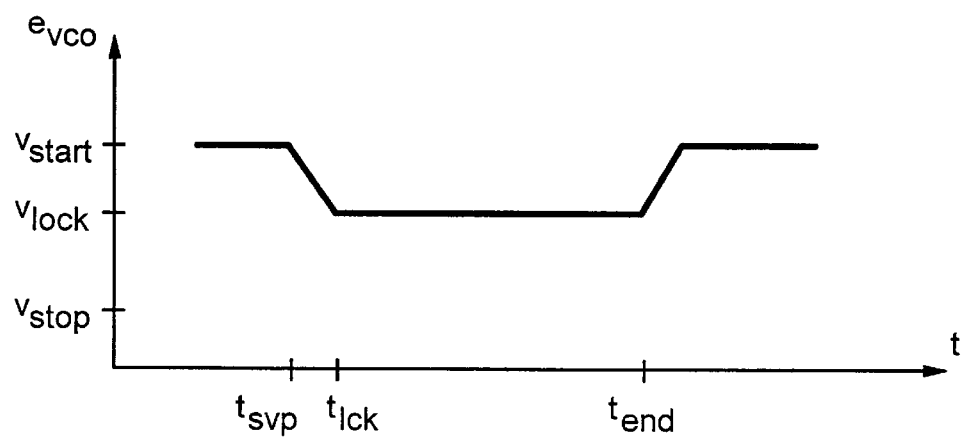
FIG. 8B is a time-amplitude diagram illustrating the variation in time of an output signal from a sweep circuit included in the device shown in FIG. 7.

The sweep circuit 60 is supplied with a voltage signal $e_{svp}$ from the filter circuit 34. A voltage signal $e_{vco}$ is delivered from the output of the sweep circuit to the voltage controlled oscillator 32. The signals $e_{svp}$ and $e_{vco}$ include the phase information to be transmitted. The sweep circuit 60 adds the sweep to the information in $e_{svp}$. A start pulse $I_{st}$ is applied to the sweep circuit input 61 at time point $t_{svp}$. The sweep circuit 60 then begins to vary $e_{vco}$ with time, in accordance with a predetermined time function. FIG. 8B illustrates an example of how the signal $e_{vco}$ can be swept by the sweep circuit 60 and varies with time t over a desired voltage interval $V_{int}=[V_{start}, V_{stop}]$. The voltage is lowered linearly from a constant high value $V_{start}$ when commencing the voltage sweep. The frequency of the output signal from the oscillator 32 is changed when $e_{vco}$ is changed. In FIG. 8B, the loop locks, $V_{lock}$, when $e_{vco}$ controls the voltage controlled oscillator 32 so that $e_{ifs}=e_{phr}$. This occurs at the arbitrary time point $t_{lck}$. The signal $e_{vco}$ is maintained at $V_{lock}$ until the output power is ramped down at time point $t_{end}$. The voltage sweep is restarted from the voltage $V_{start}$ upon the arrival of the next start pulse.

The start pulse $I_{st}$ is generated when starting up the transmitter and may be generated in a control part of the radio transmitter. The sweep circuit can be programmed, to enable different sweep control parameters to be stored in a sweep circuit control unit. The voltage interval $V_{int}=[V_{start}, V_{stop}]$ to be scanned can therewith be determined as a time interval from the time that a start pulse $I_{st}$ is sensed on the control input 61 of the sweep circuit 60.

Figure 9:
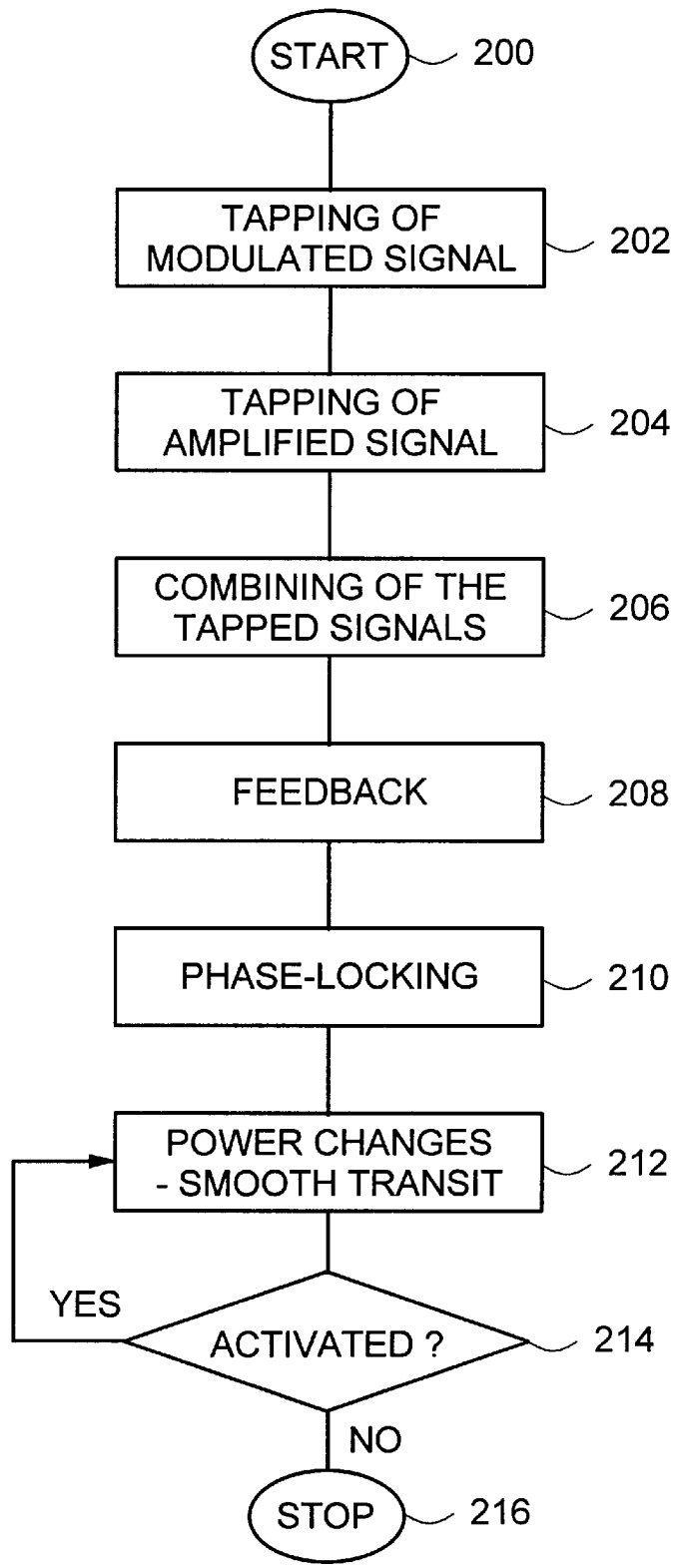
FIG. 9 is a flowchart illustrating a method of compensating for phase distortion in accordance with the inventive concept.

FIG. 9 is a flowchart illustrating a method of compensating for phase distortion in accordance with the inventive concept. Certain of the reference signs used in the following text are to be found in FIGS. 6 and 7. The method relates to phase distortion compensation in a power amplified modulated signal on the output of the power amplifier 40, wherein the amplifier has an input connected to an output on a phase-locking and upconversion loop (30–39) (the loop is also designated phase modulation control loop). The loop includes the first and the second feedback loop 33 and 36 respectively. The method commences at the upstart of the loop in a start position 200. In a first step 202 of the method, part of the modulated signal $e_{pha}$ on the input of the power amplifier 40 is taken out, or tapped off, via the first feedback loop 33. In step 204, a part of the amplified modulated signal $e_{out}$ on the output of the power amplifier 40 is taken out, or tapped off, via the second feedback loop 36. In a third step 206, the two signals that were tapped off are combined in the combining means 35 to provide a feedback signal $e_{fdb}$ that contains both of the tapped-off signals. In a following step 208, the feedback signal is fed back to the phase-locking and upconversion loop. The loop phase-locks the output signal $e_{out}$ onto the phase reference signal $e_{phr}$ in the next step 210, and therewith compensates for phase distortion in the output signal $e_{out}$ of the power amplifier. When the amplifier output power changes, the combining means 35 combines the two signals that were tapped off such as to change their relative dominance in the feedback signal in a smooth transition, so as not to lose the phase-lock and therewith the phase distortion compensation, this being effected in step 212. The method is continued whilst the loop is in operation and is not interrupted until the transmitter in which the loop is included is no longer switched on.

This step 214 is illustrated in the flowchart by a return to step 212. A termination position, step 216, is adopted immediately the transmitter is switched off.

Because the inventive method provides a smooth and continuous transition between the mutual proportionality of the tapped-off signals in the feedback signal, and therewith the relative dominance of said signals in the feedback signal, the phase-locking and upconversion loop can be phase-locked in good time before a rapid change in the output power of the power amplifier begins. It had not been possible to achieve such phase-locking with prior art techniques in which a switch is used to switch between the two feedback loops. Such a technique introduces a high degree of sensitivity when switching takes place. There is also the risk of introducing a transient in the loop when switching takes place. Such transients can cause the phase-lock to be lost together with valuable information in the loop input signal.

No transients will be introduced into the closed loop when practising the inventive method.

The inventive method and the inventive device solve the aforementioned problems associated with phase compensation in different applications, such as in radio telecommunications, etc.

We claim:

1. An apparatus for compensating for phase distortion in a power amplified modulating signal on the output of a power amplifier comprising:

said power amplifier receiving an output from a phase locking and upconversion loop;

said phase locking and up conversion loop further including a first and second feedback loop;

said first feedback loop connected to a first tap means for tapping off part of a modulated signal on the input of the power amplifier;

said second feedback loop connected to a second tap means for tapping off part of the power amplified modulated signal on the output of the power amplifier; and wherein each of the two feedback loops is connected to a respective input of a combining means to provide a feedback signal in said phase locking and upconversion loop.

2. An apparatus according to claim 1, wherein said first tap means and said second tap means are directional couplers.

3. An apparatus according to claim 2, wherein said first tap means and said second tap means are controllable directional couplers.

4. An apparatus according to claim 1, wherein said first tap means and second tap means are a voltage divider.

5. An apparatus according to claim 1, wherein said phase locking and upconversion loop includes a sweep circuit.

6. An apparatus according to claim 1, wherein said phase locking and upconversion loop includes a low-noise high-power voltage controlled oscillator.

7. An apparatus according to claim 1, wherein said power amplifier is pulsed.

8. A method of compensating for phase distortion in a power amplified signal on the output of a power amplifier, wherein said amplifier has an input connected to an output of a phase locking and upconversion loop which includes a first and second feedback loop, said method comprising;

tapping off a part of said modulated signal on the input of the power amplifier through said first feedback loop;

tapping off a part of said amplified modulated signal on the output of said power amplifier through said second feedback loop;

combining said tapped-off signals to obtain a feedback signal;

feeding said feedback signal to a mixer to form an intermediate signal;

sending said intermediate signal to a phase detector which generates an error signal based on said intermediate signal and a phase reference signal;

phase locking said amplified modulated signal to said phase reference signal incoming on the phase locking and upconversion loop; and changing mutual dominance of said tapped off signals in said feedback signal in a transmission, in the event of a change in the output power of the power amplifier.

9. A method according to claim 8, comprising the step, increasing the dominance in the feedback signal of the signal tapped from said output of said power amplifier.

10. A method according to claim 8, comprising the step; locking the phase locking and upconversion loop to said amplified modulated signal on the output of said power amplifier before the output power has reached full strength.

11. A method according to claim 10, wherein the power amplified modulated signal is dominant in the feedback signal when said power amplifier amplifies with full output power.

12. A method according to claim 8, comprising the step; locking the phase locking and up conversion loop to the input of the power amplifier before the output power of the power amplifier is increased.

13. A method according to claim 12, wherein said modulated signal on the input of the power amplifier is dominant in the feedback signal when output power of the power amplifier is low.

14. A method according to claim 8, wherein said power amplifier is pulsed.

* * * * *